(12) United States Patent  
Yoneda

(10) Patent No.: US 6,951,495 B2
(45) Date of Patent: Oct. 4, 2005

(54) DISPLAY APPARATUS HAVING ELECTROLUMINESCENCE ELEMENTS

(75) Inventor: Kiyoshi Yoneda, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/629,058

(22) Filed: Jul. 28, 2003

(65) Prior Publication Data

US 2004/0021434 A1 Feb. 5, 2004

Related U.S. Application Data

(63) Continuation of application No. 09/258,499, filed on Feb. 26, 1999, now Pat. No. 6,630,784.

(30) Foreign Application Priority Data

Feb. 27, 1998 (JP) ............................................... 10-47565

(51) Int. Cl.[7] .................................................. H01J 9/00
(52) U.S. Cl. .......................................... 445/24; 445/51
(58) Field of Search .............................. 445/23–25, 35, 445/50, 51; 313/498–506; 257/72, 59, 93, 71

(56) References Cited

U.S. PATENT DOCUMENTS

| 5,550,066 A | 8/1996 | Tang et al. |
| 5,640,067 A | 6/1997 | Yamauchi et al. |
| 5,670,792 A | 9/1997 | Utsugi et al. |
| 5,677,594 A | 10/1997 | Sun et al. |
| 5,909,081 A | 6/1999 | Eida et al. |
| 5,932,327 A | 8/1999 | Inoguchi et al. |
| 5,990,629 A | 11/1999 | Yamada et al. |
| 6,072,450 A | 6/2000 | Yamada et al. |
| 6,114,715 A | 9/2000 | Hamada |

FOREIGN PATENT DOCUMENTS

| JP | 3034292 | 2/1991 |
| JP | 3289090 | 12/1991 |
| JP | 7057871 | 3/1995 |
| JP | 7-111341 | 4/1995 |
| JP | 8054836 | 2/1996 |
| JP | 8124679 | 5/1996 |
| JP | 8222369 | 8/1996 |
| JP | 9-245968 | 9/1997 |
| JP | 9330792 | 12/1997 |
| JP | 10-39792 | 2/1998 |
| JP | 10161563 | 6/1998 |
| JP | 10189252 | 7/1998 |
| JP | 10289784 | 10/1998 |

OTHER PUBLICATIONS

Notice of Grounds for Rejection, JP App. Ser. No. Hei 10–047565.

Notice of Grounds for Rejection, JP App. Ser. No. Hei 10–047564.

Primary Examiner—Joseph Williams
(74) Attorney, Agent, or Firm—Cantor Colburn LLP

(57) ABSTRACT

A display apparatus includes display pixels each having a thin film transistor and an EL element formed successively forming over a substrate. The EL element has a cathode electrode connected to the source of the thin film transistor and an anode electrode, and is driven by the thin film transistor. The EL element externally emits light from the reverse side of the substrate. For example, when the cathode electrode is formed the comblike, meshlike, or gridlike pattern on the luminous layer, the light is emitted through the slits of the cathode pattern. The display apparatus is provided that can improve the aperture ratio of a display pixel and can increase the degree of freedom in deciding the size and the drive capability of a TFT element which drives an EL element.

6 Claims, 5 Drawing Sheets

DISPLAY APPARATUS HAVING ELECTROLUMINESCENCE ELEMENTS

CROSS REFERENCE TO RELATED APPLICATIONS

This application is a continuation application of U.S. patent application Ser. No. 09/258,499, filed on Feb. 26, 1999 now U.S. Pat. No. 6,630,784, and which is herein incorporated by reference in its entirety.

BACKGROUND OF THE INVENTION

1. Field of the Invention

The present invention relates to a display apparatus that includes electroluminescence (hereinafter referred to as EL) elements and thin film transistors (hereinafter referred to as TFTs) which are fabricated on a substrate, and also to a method of fabricating the same.

2. Description of the Related Art

Recently, display apparatus using TFT elements and EL elements such as organic EL elements have been noted as display devices, in place of the CRTs (Cathode Ray Tubes) or LCD (Liquid Crystal Display) apparatus.

FIG. 1 is a cross sectional view illustrating a conventional display apparatus including organic EL elements and TFT elements. FIG. 1 shows a laminated structure in which an organic EL element is deposited over a TFT structure. The structure is formed as follows:

A gate electrode 2 is formed on a transparent insulating substrate 1 such as glass or synthetic resin. An insulating film 3 is formed on the gate electrode 2. An active layer 4 of polycrystalline silicon is formed on the insulating film 3. A source region 4s and a drain region 4d into which impurities are implanted are formed in the active layer 4. An interlayer insulating film 8 formed of a $SiO_2$ film 6 and a SiN film 7 is formed on the active layer 4. The source region 11s is connected to the source electrode 10s via the contact hole 9 formed in the interlayer insulating film 8. The drain region 4d is connected to the drain electrode 10d via the contact hole 9 formed in the interlayer insulating film 8.

Planarization insulating film 11 is formed on the electrodes 10s and 10d and the interlayer insulating film 8. The source electrode 10s is connected to an anode electrode 28 of an organic EL element formed on a TFT element via the contact hole 12 formed in the planarization insulating film 11.

The organic EL element is formed by successively laminating an anode 2 formed of: a transparent electrode of ITO (Indium Tin oxide); an organic layer comprised a second hole transfer layer 27 of MTDATA (4,4'-bis(3-methylphenylphenylamino)biphenyl), a first hole transfer layer 26 of TPD (4,4',4''-tris(3-methylphenylphenylamino) triphenylamine), a luminous layer 25 of Bebq2(10-benzo[h] quinolinol-beryllium complex) containing Quinacridone derivative, and an electron transfer layer 24 of Bebq2; and a cathode electrode 23 of magnesium and indium alloy (MgIn). The organic layer is made of an organic chemical compound. Thus, an EL element is constructed the organic layer, the anode electrode 28, and the cathode electrode 23.

In the organic EL element, the holes injected from the anode electrode 28 and the electrons injected from the cathode electrode 23 are recombined inside the luminous layer 25. Excitons are generated by exciting the organic molecules of the luminous layer 25. The luminous layer 25 radiates light through the process of the excitons disappearing. The light is radiated out from the transparent anode electrode 28 through the transparent insulating substrate 1.

However, in the conventional display apparatus structure, since the organic EL element emits light through the side of the substrate 1 on which TFT elements are formed, the TFT structure blocks the emitted light so that the display pixel aperture ratio cannot be increased.

Furthermore, since the TFT elements must be small-sized to the extent that the luminous light is not blocked, there are severe limitations on increasing the size of each TFT element as well as the TFT element capability.

SUMMARY OF THE INVENTION

The present invention is made to solve the above-mentioned problems involved in the conventional display apparatus. It is an object of the invention to provide a display apparatus that can improve the display pixel aperture ratio and can increase the degree of freedom in deciding the size and the drive capability of a thin film transistor which drives an EL element.

According to the present invention, the display apparatus comprises: a substrate; thin film transistors formed on the substrate, each of the thin film transistors having a source electrode and a drain electrode; and electroluminescence elements respectively formed over the thin film transistors, each of the electroluminescence elements having a cathode electrode, an anode electrode, and a luminous layer formed between the cathode electrode and the anode electrode; wherein each of the electroluminescence elements emits toward the reverse side of the substrate.

Each of the electroluminescence elements comprises the cathode electrode, the luminous layer and the anode electrode successively formed above the thin film transistor. The cathode electrodes is connected to a source or drain electrode of the corresponding thin film transistor. Moreover, each of the thin film transistors drives the corresponding electroluminescence element.

Since light is emitted from the reverse side of the substrate, the thin film transistor formed on the substrate side does not block the light, so that the aperture ratio can be increased.

It is not required to miniaturize the thin film transistor to the extent that the light is not shielded. Hence, the thin film transistor can be designed with high freedom of size. Thin film transistors with high performance can be formed without constraints in size.

According to the present invention, the electroluminescence element is constructed by successively forming a cathode electrode, a luminous layer, and an anode electrode over the thin film transistor.

The anode electrode is made of a metal material and can cover over only a part of the display pixel area within a unit display pixel area.

The above-mentioned planar structure can externally emit light from the reverse side of the substrate, that is, the anode side. Moreover, the anode electrode in, for example, a comblike, meshlike or gridlike form can externally emit a sufficient amount of light.

The anode electrode of the electroluminescence element can be formed by a vapor evaporation process.

Furthermore, according to the present invention, the display apparatus is fabricated through the steps of forming the thin film transistors on a substrate; forming an insulating film to cover the thin film transistor; forming contact hole at predetermined position of the insulating film, and then forming the cathode electrode of each of the electroluminescence elements to respectively make contact with a source electrode or a drain electrode of the thin film transistor via the holes; forming said luminous layer over the cathode electrode; and forming an anode electrode over the luminous layer using an opaque metal material through a vapor evaporation method.

The anode electrode is preferably formed to partially occupy a unit display pixel region.

The electroluminescence element comprises an organic electroluminescence element using an organic material for the luminous layer.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Next, an embodiment of a display apparatus according to the present invention will be described below with reference to the attached drawings.

Figure 2:
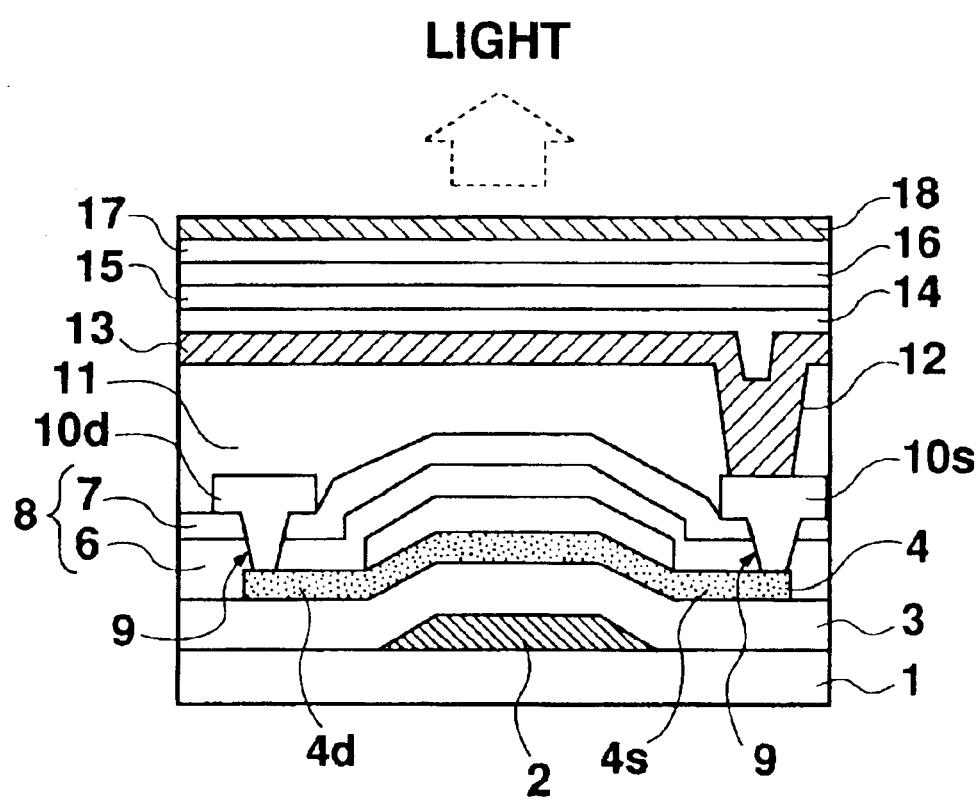
FIG. 2 is a cross sectional view schematically illustrating one display pixel structure in a fabrication step according to an embodiment of the present invention.

FIG. 2 is a cross sectional view illustrating one pixel of a display apparatus having organic EL elements and TFT elements, according to the present applicant.

Figure 1:
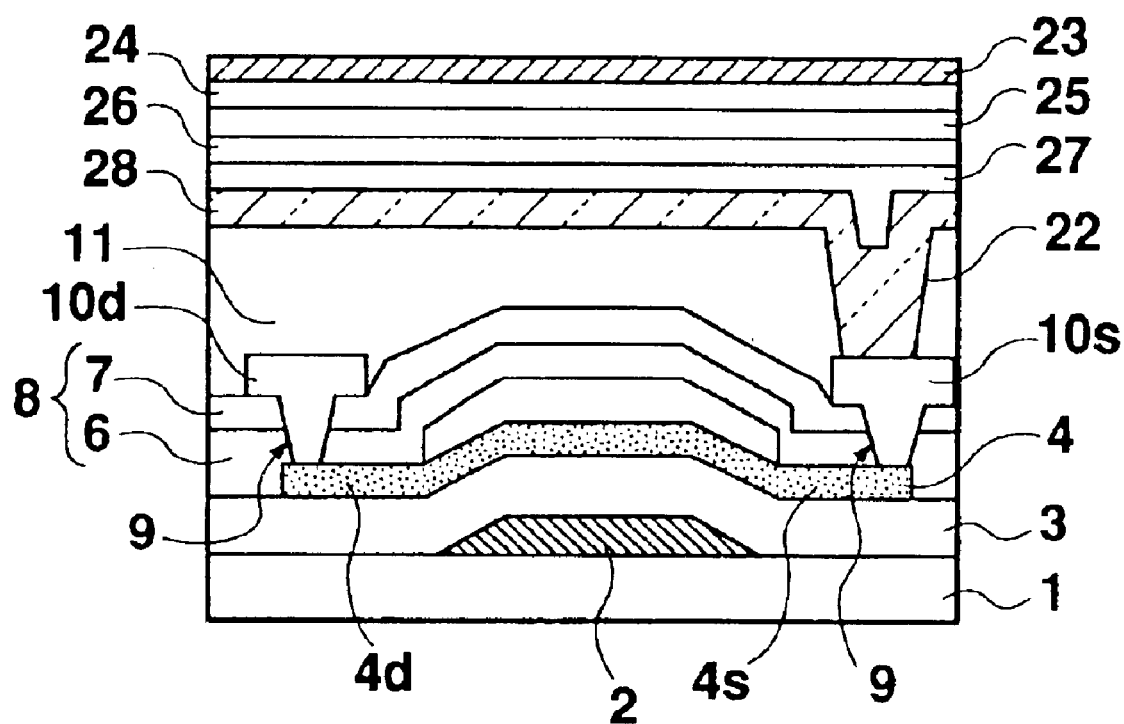
FIG. 1 is a cross sectional view schematically illustrating one display pixel structure in a conventional color display apparatus.

The display apparatus shown in FIG. 2 differs from that shown in FIG. 1 in that the TFT element and the organic element are reversely formed on the substrate 1.

In each display pixel, an TFT element and an organic EL element are laminated over an insulating substrate which is made of glass synthetic resin, or a conductive substrate or a semiconductor substrate on which an insulating film such as $SiO_2$ film or SiN film is formed. The substrate 1 may be a transparent or opaque substrate.

The TFT structure formed on the substrate 1 is the same as that of the conventional TFT structure, and so repeated explanation will be omitted here. The source electrode 10s is connected to the cathode electrode 13 of an organic EL element formed over the TFT element via the contact hole formed in the planarization insulating film 11. The source electrode 10s supplies the drain signal from the TFT element to the organic EL element via the drain signal line.

The organic EL element is formed by successively laminating a cathode electrode 13, an electron transfer layer 14, a luminous layer 15, first and second hole transfer layers 16 and 17, and an anode electrode 18. The cathode electrode 13 comprises a magnesium and indium (MgIn) alloy or aluminum and lithium (AlLi) alloy and is connected to the source electrode 10S of the TFT element. The electron transfer layer 14 comprises of Bebq2. The luminous layer 15 comprises of Bebq2(10-benzo[h]quinolinol-beryllium complex) containing Quinacridone derivative. The first hole transfer layer 16 comprises TPD: triphenylamine dimer (4,4',4"-tris (3-methylphenylphenylamino)triphenylamine). the second hole transfer layer 17 comprises MTDATA (4,4'-bis(3-methylphenylphenylamino)biphenyl). The anode electrode 18 comprises a metal electrode such as Pt, Rh or Pd and is shaped in comblike, meshlike or gridlike pattern (FIGS. 3A and 3B)).

In the luminous layer of each organic EL element, each of the electron transfer layer, the luminous layer, the first hole transfer layer and the second hole transfer layer comprises an organic chemical compound. Each organic layer is sandwiched between the anode electrode and the cathode electrode. The hole transfer layer may be a single layer.

The holes injected from the anode electrode 18 and the electrons injected from the cathode electrode 13 are recombined together inside the luminous layer 15. Organic molecules comprising the luminous layer 15 are excited so that excitons are produced. The luminous layer 15 emits light through the process of the excitons disappearing. The emitted light is radiated out from the anode electrode 18 (to the upper vertical orientation in FIG. 2)

The light emitted from the luminous layer travels toward both the cathode electrode and the anode electrode but is reflected back from the metal cathode electrode without externally penetrating it. As a result, the light is radiated out through the slits of the anode electrode in a comblike, meshlike or gridlike pattern.

An organic EL display apparatus is constructed by arranging the thus-configured display pixels in a matrix form.

Here, the form of an anode electrode as well as the anode electrode fabricating method will be described below.

In the display apparatus of the invention having a laminated structure where an EL element is placed on a TFT element, the anode electrode is formed on the luminous element layer.

If the anode electrode 18 is formed on the luminous element layer by the ITO (Indium Tin Oxide) sputtering process in the prior art, the luminous element layer previously formed will be damaged.

According to the present invention, the anode electrode 18 is formed by vapor evaporating an opaque metal. This approach allows the anode electrode 18 to be formed over the luminous element layer with no occurrence of damage. However, if the anode electrode 18 is formed of a metal material over the entire surface of a luminous element layer, the metal material blocks the emitted light, so that the emitted light cannot be radiated outward. This means that the display apparatus does function normally.

Figure 3A:
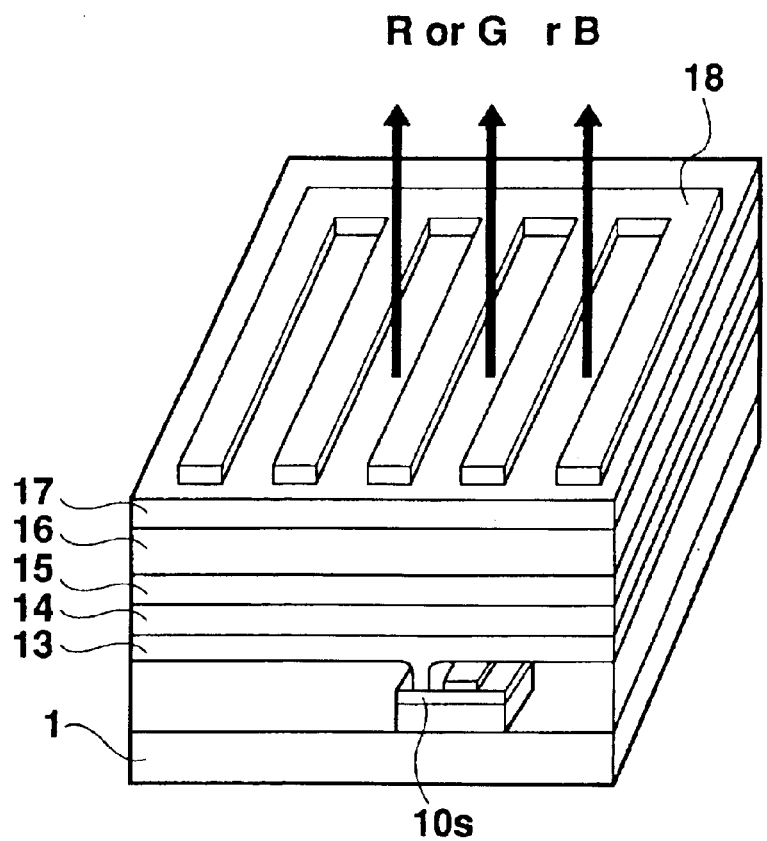
FIGS. 3A and 3B are cross sectional views each schematically illustrating the anode electrode for a display pixel according to an embodiment of the present invention.
Figure 3B:
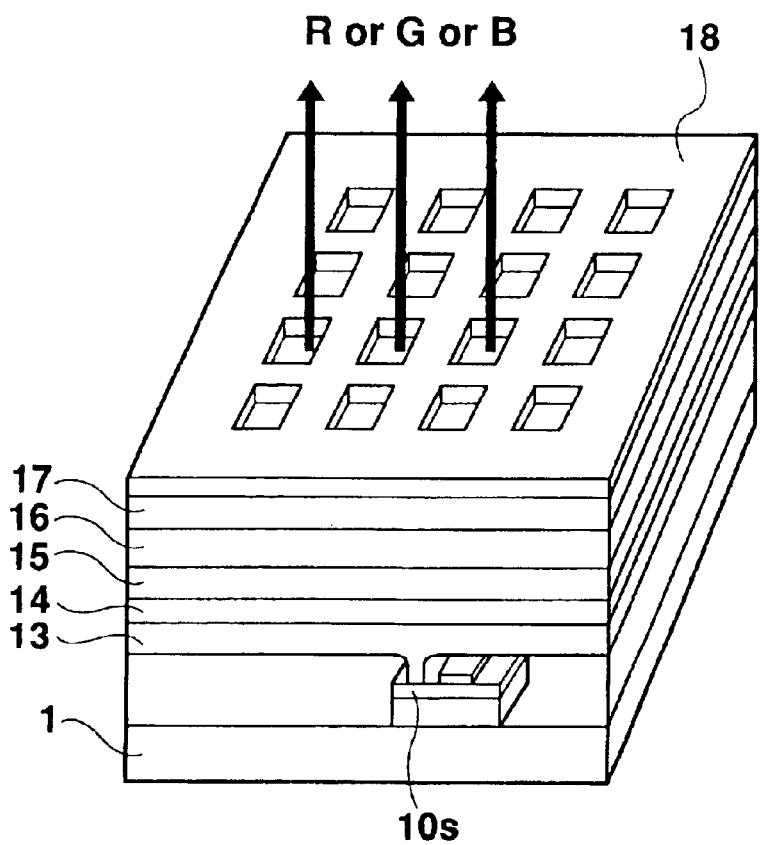

In order to deal with such problems, the anode electrode 18 is formed in a comblike (FIG. 3A), meshlike or gridlike pattern (FIG. 3B), so that light is emitted from the reverse side of the substrate, that is, through the slits in the anode electrode 18 (in the arrow direction of FIGS. 3A and 3B). The gap between comb teeth or the aperture size of the mesh is selected to a brightness required as a display apparatus.

Next, the display apparatus fabricating method will be described below. FIGS. 4A to 4E are cross sectional views illustrating a process flow in manufacturing a display apparatus according to the present invention.

Figure 4A:
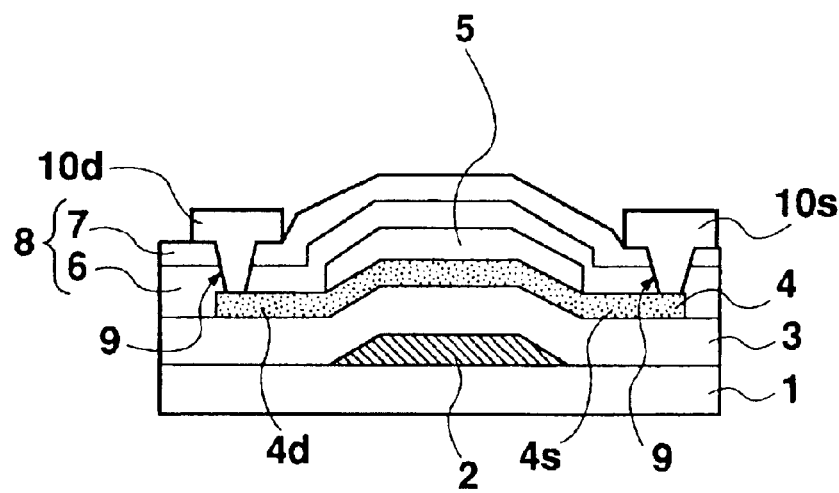
FIGS. 4A, 4B, 4C, 4D and 4E are cross sectional views each schematically illustrating a fabrication step according to an embodiment of the present invention.

In the step 1, as shown in FIG. 4A, a gate electrode 2 of a refractory metal (a high-melting point metal) such as chromium (Cr) or molybdenum (Mo) is formed on the substrate 1 of which at least the surface is insulative.

An insulating film 3 and a p-Si active layer 4 are formed all over the surface of the substrate to cover the gate electrode 2. A stopper 5 of $SiO_2$ film is formed on the p-Si film 4.

With the stopper 5 acting as a mask, P-type or N-type ions are doped into the p-Si film 4 to form the source region 4s and the drain region 4d. The region masked by the stopper 5 and not doped with ions is defined between the source region 4s and the drain region 4d and will act as a channel. An interlayer insulating film 8 formed of a SiO$_2$ film 6 and a SiN film 7 is formed on the channel. A first contact hole 9 penetrating the interlayer insulating film 8 is formed at the position corresponding to the source region 4s while a first contact hole 9 penetrating the interlayer insulating film 8 is formed at the position corresponding to the drain region 4d. A source electrode 10s is formed to connect to the source region 10s via the first contact hole 9 while a drain electrode 10d is formed to connect to the drain region 10d via the first contact hole 9.

Thus, a TFT (poly-silicon thin film transistor, hereinafter referred to as "p-SiTFT") which has a p-Si active layer and drives an organic EL element is fabricated. The material for the active layer is not limited to p-Si, but may be amorphous silicon or fine crystalline silicon.

Next, the step of forming an organic EL element on the TFT element will be described below.

Figure 4B:
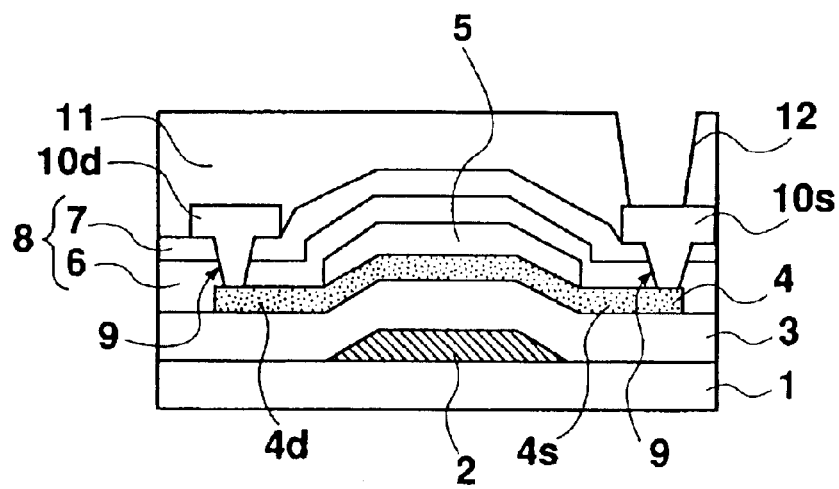

In the step 2, as shown in FIG. 4B, a planarization insulating film 11 comprises on the insulating film 8 and the electrodes 10s and 10d of the p-Si TFT element. The planarization insulating film 11 comprises a silicon oxide film, a silicon nitride film, a silicon nitride oxide film, a silicate glass film, a SOG (Spin On Glass) film, or a synthetic resin film (ex. polyimide resin film, organic silica film or acrylic resin film). A contact hole 12 is formed in the planarization insulating film 11.

Figure 4C:
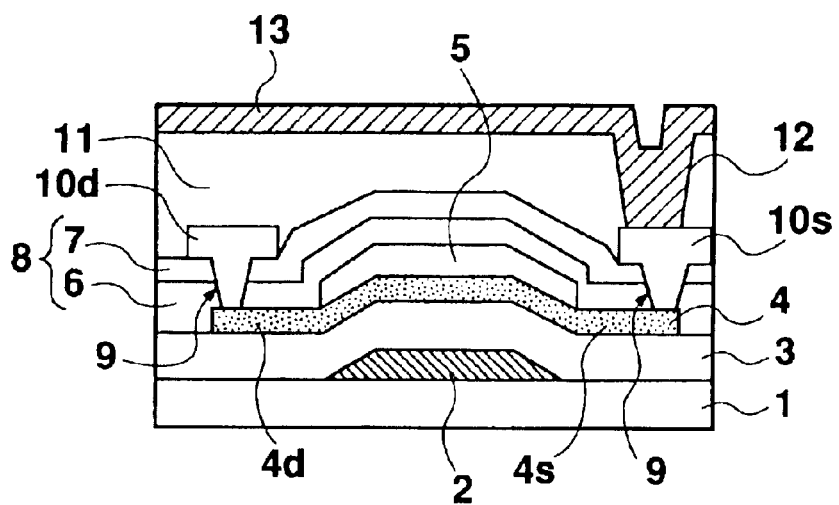

In the step 3, as shown in FIG. 4C, the cathode electrode 13 of either magnesium and indium alloy (MgIn) or aluminum and lithium (AlLi) alloy of an organic EL element is formed on the planarization insulating film 11. The cathode electrode 13 is connected to the source electrode 10s via the contact hole 12 formed in the planarization insulating film 11.

Figure 4D:
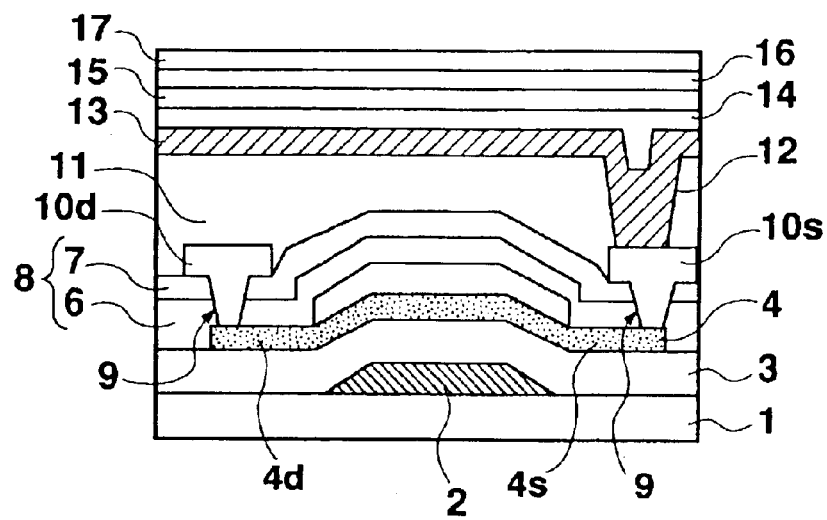

In the step 4 shown in FIG. 4D, an electron transfer layer 14 comprises Bebq2, a luminous layer 15 comprised Bebq2 (10-benzo[h]quinolinol-beryllium complex) containing quinacridone derivative, a first hole transfer layer 16 comprised TPD(4,4',4"-tris(3-methylphenylphenylamino) triphenylamine), and a second hole transf r layer 17 comprised MTDATA (4,4'-bis(3-methylphenylphenylamino) biphenyl) are successively over the cathode electrode 13.

Figure 4E:
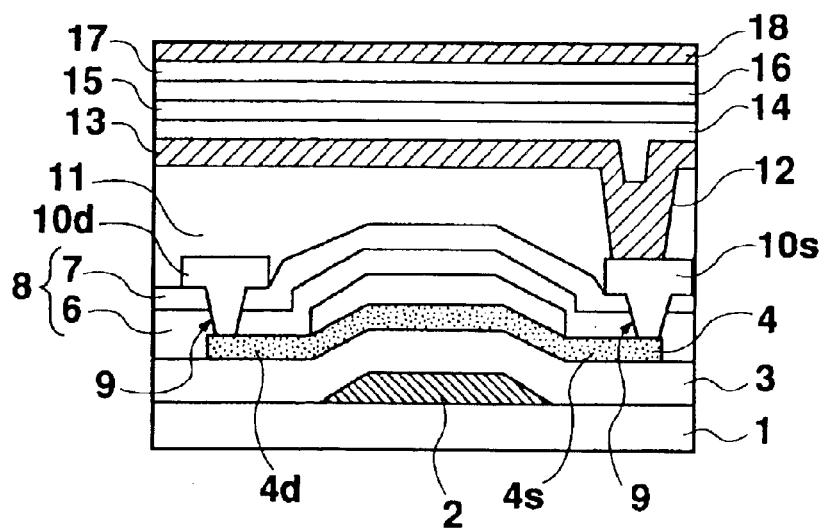

In the step 5 shown in FIG. 4E, a metal film of, for example, Pt, Rh or Rd is vapor evaporated on the second hole transfer layer 17 to form the anode electrode 18.

The anode electrode 18 may be formed by vacuum evaporating metal in an ion state using the ion cluster method.

What is claimed is:

1. A method for manufacturing a display apparatus including a thin film transistor formed over a substrate, the thin film transistor having a source electrode and a drain electrode, and an electroluminescence element formed over the thin film transistor and having a luminous element layer between a lower electrode and an upper electrode, wherein the lower electrode, the luminous element layer, and the upper electrode of the electroluminescence element are formed over the thin film transistor in that order, the upper electrode being formed using a non-transparent metal material and through evaporation so that the upper electrode has a planar shape covering a portion of a display pixel region in a unit display pixel region, and light emission from the electroluminescence element is emitted to the outside from an upper electrode side opposite of the substrate.

2. A method for manufacturing a display apparatus according to claim 1, wherein one of the source electrode and the drain electrode of the thin film transistor is electrically connected to the lower electrode of the electroluminescence element.

3. A method for manufacturing a display apparatus according to claim 1, wherein light emission from the electroluminescence element is emitted through an opening region which is not covered by the upper electrode within the unit display pixel region on the side near the upper electrode positioned opposite of the substrate.

4. A method for manufacturing a display apparatus comprising the steps of:

forming a thin film transistor having a source electrode and a drain electrode over a substrate;

forming at least one layer of insulating film covering the thin film transistor; and after the formation of the insulating film, forming an electroluminescence element having a luminous element layer between a lower electrode and an upper electrode, by forming a light reflective conductive material layer as a lower electrode, forming a luminous element layer, and forming an upper electrode on the luminous element layer through evaporation of a non-transparent metal material layer having a planar shape covering a portion of a display pixel region within a unit display pixel region, wherein light emission from the electroluminescence element is emitted to the outside from the side near the upper electrode opposite of the substrate.

5. A method for manufacturing a display apparatus according to claim 4, further comprising the steps of:

forming a contact hole through the at least one layer of insulating film covering the thin film transistor; and electrically connecting one of the source electrode and the drain electrode of the thin film transistor and the lower electrode of the electroluminescence element.

6. A method for manufacturing a display apparatus according to claim 4, wherein light emission from the electroluminescence element is emitted through an opening region which is not covered by the upper electrode within the unit display pixel region on the side near the upper electrode positioned opposite of the substrate.

* * * * *